(12) United States Patent
Nyhus et al.

(10) Patent No.: US 10,319,625 B2
(45) Date of Patent: Jun. 11, 2019

(54) METAL VIA PROCESSING SCHEMES WITH VIA CRITICAL DIMENSION (CD) CONTROL FOR BACK END OF LINE (BEOL) INTERCONNECTS AND THE RESULTING STRUCTURES

(71) Applicant: Intel Corporation, Santa Clara, CA (US)

(72) Inventors: Paul A. Nyhus, Portland, OR (US); Mohit K. Haran, Hillsboro, OR (US); Charles H. Wallace, Portland, OR (US); Robert M. Bigwood, Hillsboro, OR (US); Deepak S. Rao, Portland, OR (US); Alexander F. Kaplan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/772,711

(22) PCT Filed: Dec. 22, 2015

(86) PCT No.: PCT/US2015/067431
§ 371 (c)(1),
(2) Date: May 1, 2018

(87) PCT Pub. No.: WO2017/111953
PCT Pub. Date: Jun. 29, 2017

(65) Prior Publication Data
US 2018/0323100 A1 Nov. 8, 2018

(51) Int. Cl.
*H01L 21/768* (2006.01)
*H01L 21/033* (2006.01)
*H01L 21/311* (2006.01)

(52) U.S. Cl.
CPC .... *H01L 21/76816* (2013.01); *H01L 21/0337* (2013.01); *H01L 21/31144* (2013.01);
(Continued)

(58) Field of Classification Search
None
See application file for complete search history.

(56) References Cited

U.S. PATENT DOCUMENTS

| | | | |
|---|---|---|---|
| 8,614,144 B2 * | 12/2013 | Kato | H01L 21/76816 438/667 |
| 8,785,319 B2 * | 7/2014 | Park | H01L 21/31144 438/623 |

(Continued)

FOREIGN PATENT DOCUMENTS

KR 10-2014-0028376 3/2014

OTHER PUBLICATIONS

International Preliminary Report on Patentablity for International Patent Application No. PCT/US2015/067431, dated Jul. 5, 2018, 7 pages.

(Continued)

*Primary Examiner* — Chandra Chaudhari
(74) *Attorney, Agent, or Firm* — Schwabe, Williamson & Wyatt, P.C.

(57) ABSTRACT

Via CD control for BEOL interconnects is described. For example, a method of fabricating an interconnect structure includes forming a lower metallization layer comprising alternating metal lines and dielectric lines above a substrate. The method also includes forming an inter-layer dielectric layer above the metallization layer. The method also includes forming a first grating pattern above the inter-layer dielectric layer, orthogonal to the alternating metal lines and dielectric lines of the lower metallization layer. The method also includes forming a second grating pattern above the first grating pattern. The method also includes patterning the
(Continued)

inter-layer dielectric layer using the first grating pattern and the second grating pattern to form via locations and line regions in the inter-layer dielectric layer. The method also includes forming metal vias and metal lines in the via locations and line regions, respectively, of the inter-layer dielectric layer.

20 Claims, 14 Drawing Sheets

(52) U.S. Cl.
CPC .. *H01L 21/76811* (2013.01); *H01L 21/76897* (2013.01); *H01L 21/76877* (2013.01)

(56) References Cited

U.S. PATENT DOCUMENTS

| | | |
|---|---|---|
| 9,041,217 B1 * | 5/2015 | Bristol .............. H01L 21/76897 257/774 |
| 9,087,844 B2 | 7/2015 | Kim et al. |
| 2012/0031487 A1 | 2/2012 | Kuang et al. |
| 2012/0214311 A1 | 8/2012 | Burkhardt et al. |
| 2014/0353800 A1 | 12/2014 | Guillorn et al. |
| 2015/0171010 A1 | 6/2015 | Bristol et al. |

OTHER PUBLICATIONS

International Search Report and Written Opinion for International Patent Application No. PCT/US2015/067431 dated Sep. 20, 2016, 10 pgs.

* cited by examiner

PLAN VIEWS
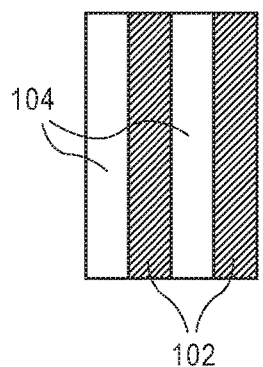
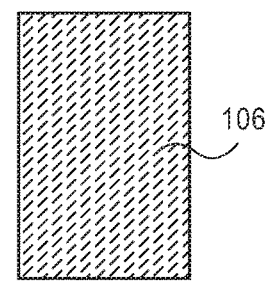
ANGLED VIEWS
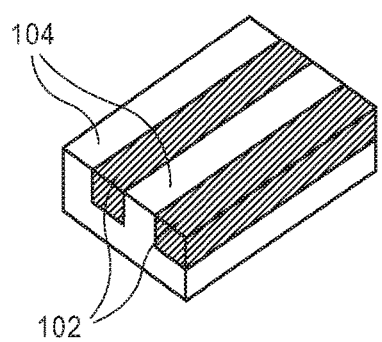
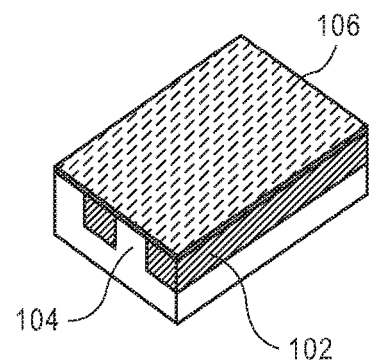
CROSS-SECTIONAL VIEWS
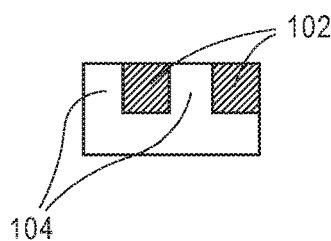
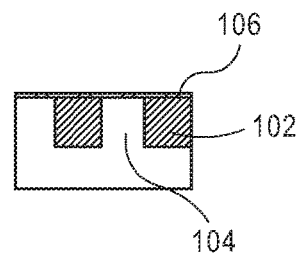
FIG. 1A    FIG. 1B

100  PLAN VIEWS
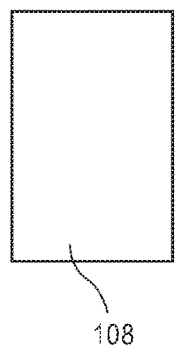 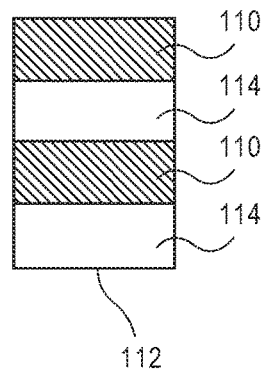
ANGLED VIEWS
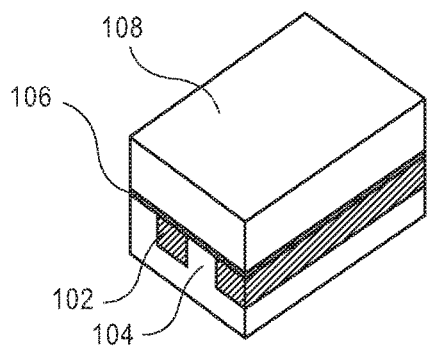 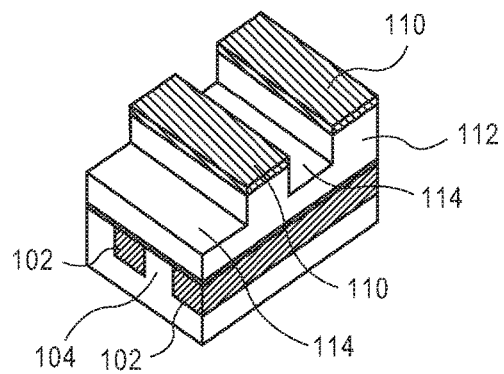
CROSS-SECTIONAL VIEWS
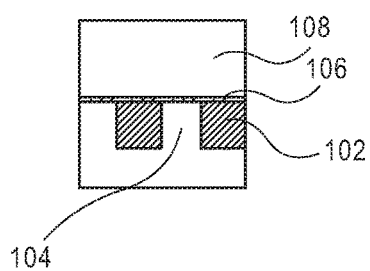 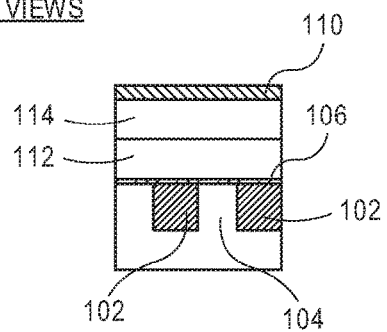
FIG. 1C   FIG. 1D

PLAN VIEWS
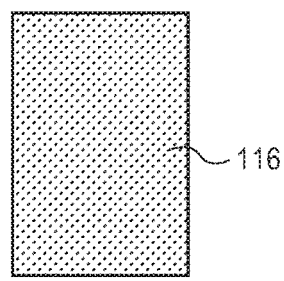
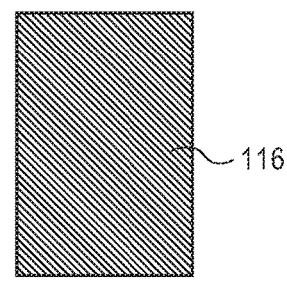
ANGLED VIEWS
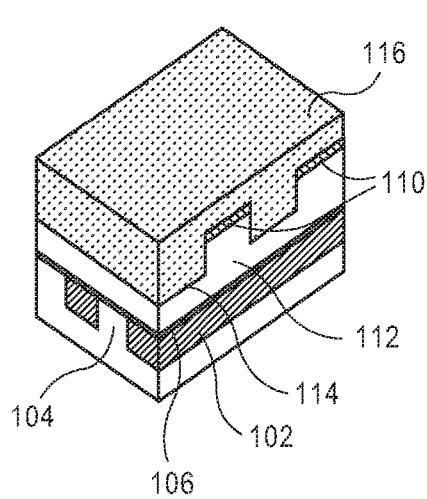
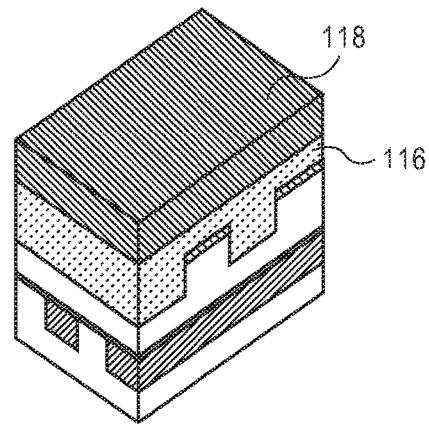
CROSS-SECTIONAL VIEWS
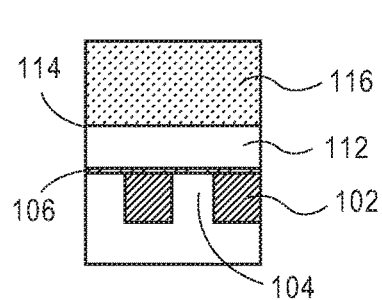
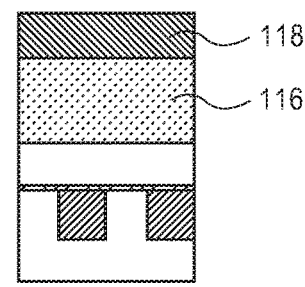
FIG. 1E　　　FIG. 1F

PLAN VIEWS
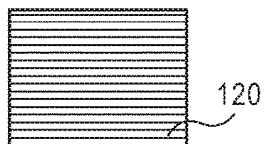
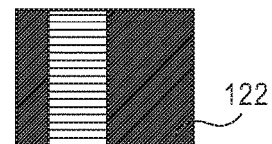
ANGLED VIEWS
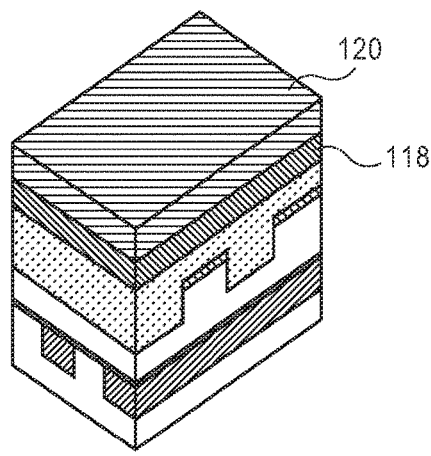
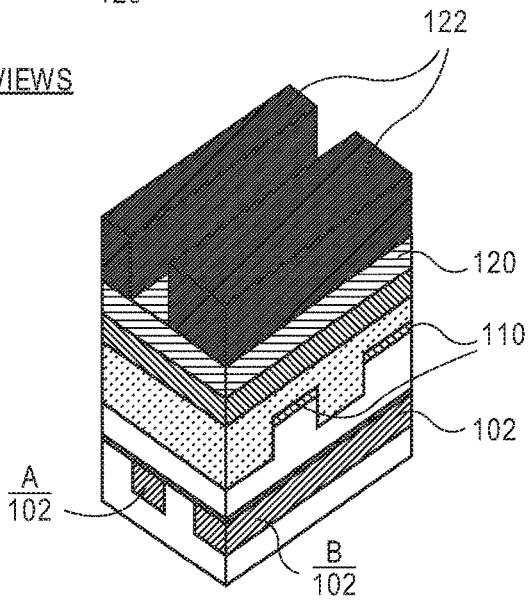
CROSS-SECTIONAL VIEWS
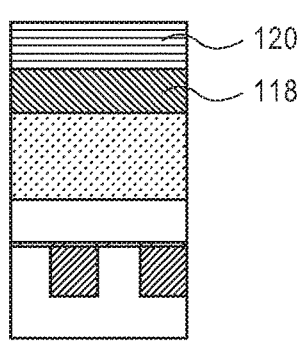
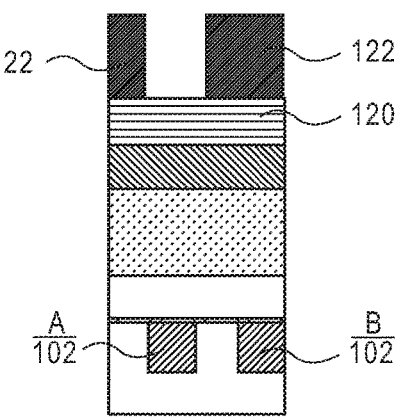
FIG. 1G  FIG. 1H

PLAN VIEWS
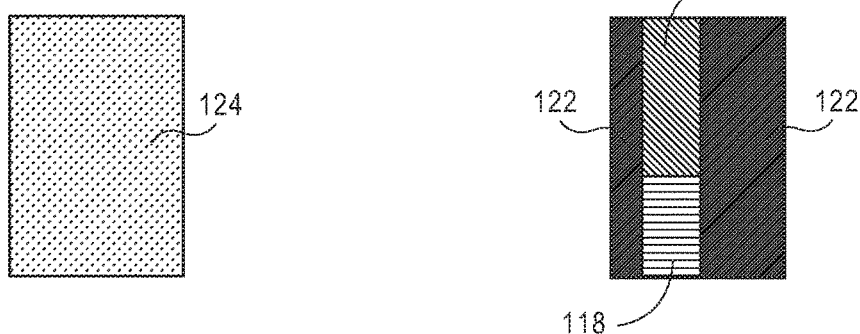
ANGLED VIEWS
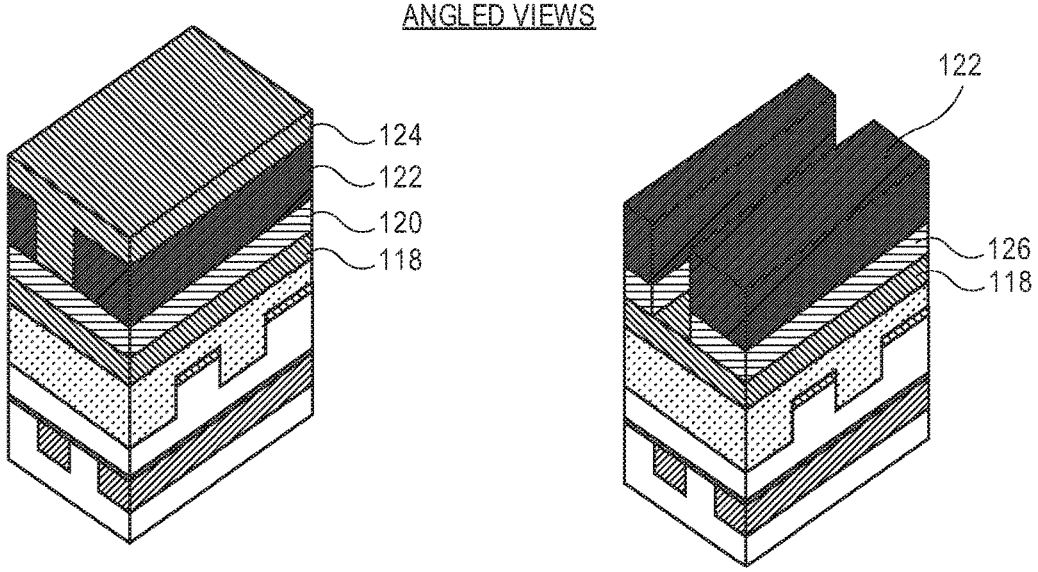
CROSS-SECTIONAL VIEWS
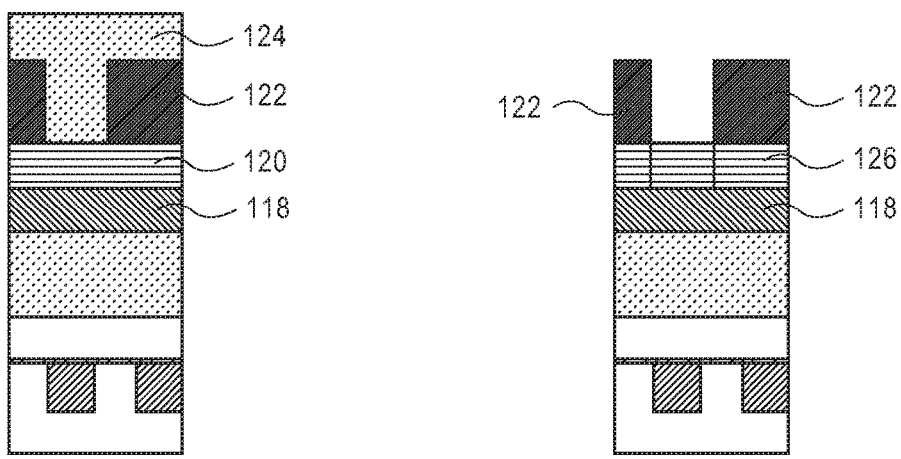
FIG. 1I          FIG. 1J

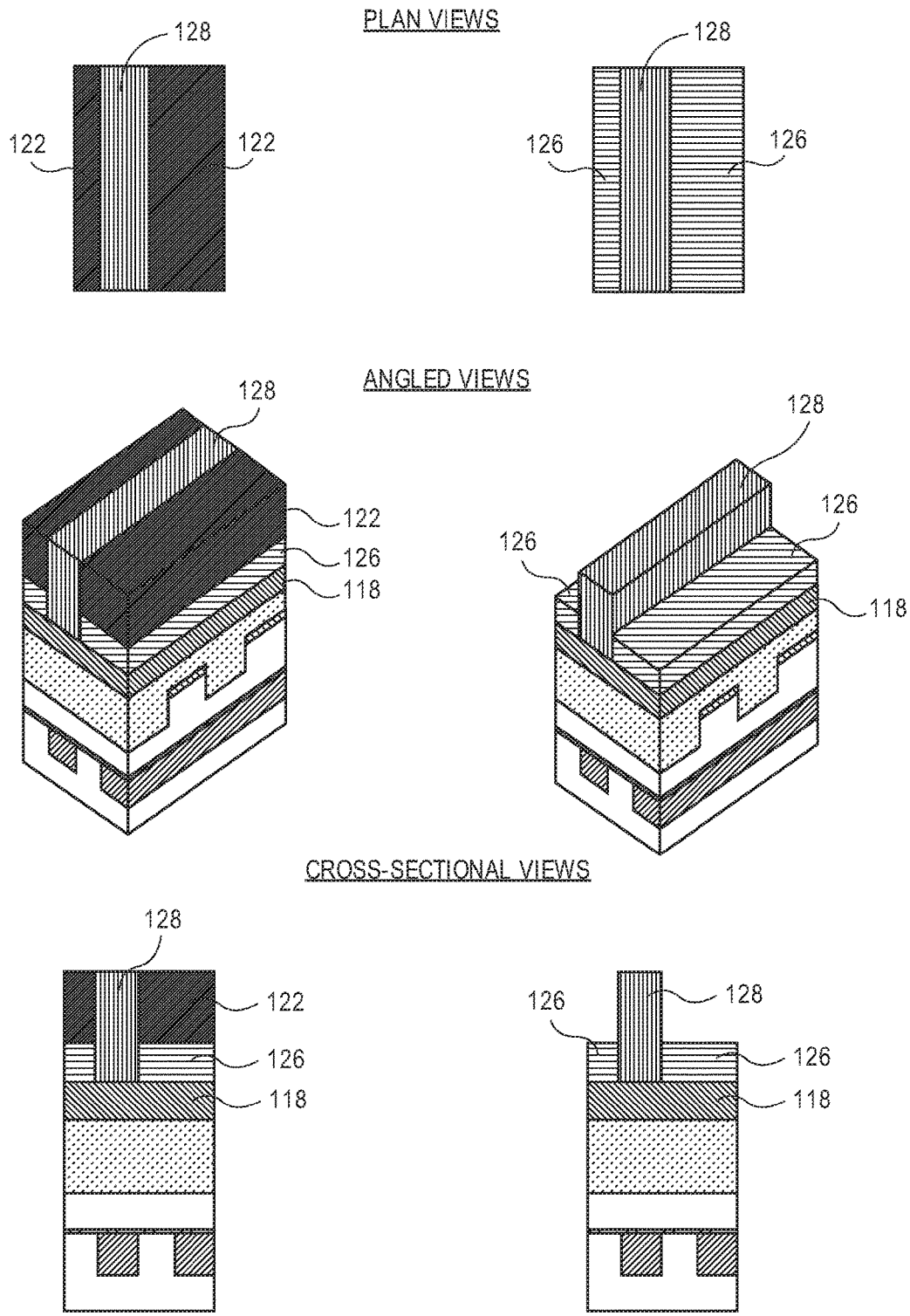

PLAN VIEWS
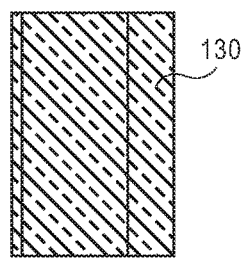
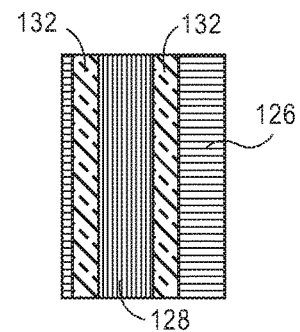
ANGLED VIEWS
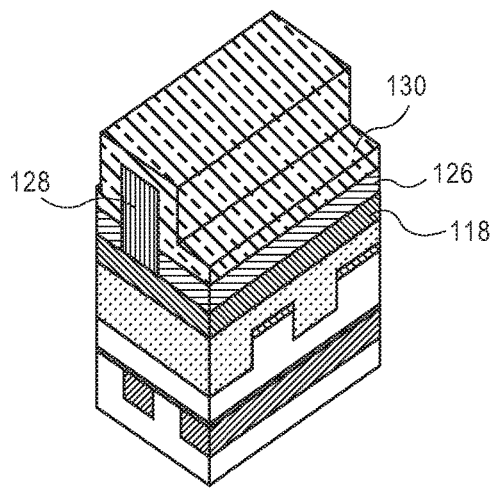
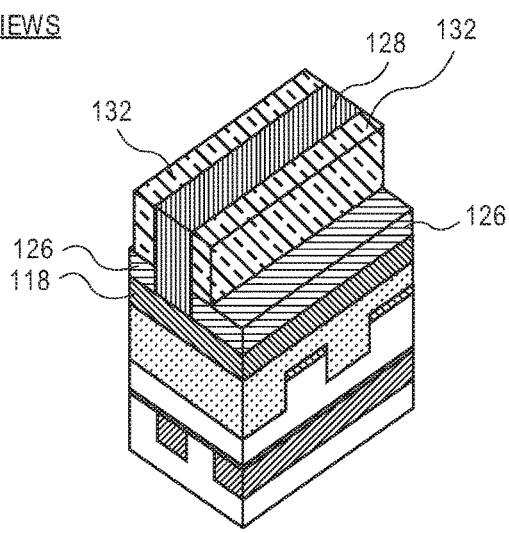
CROSS-SECTIONAL VIEWS
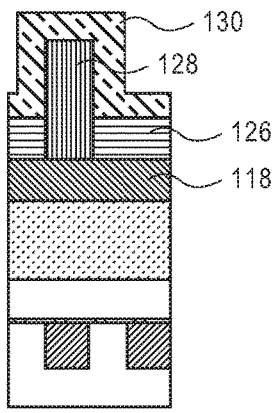
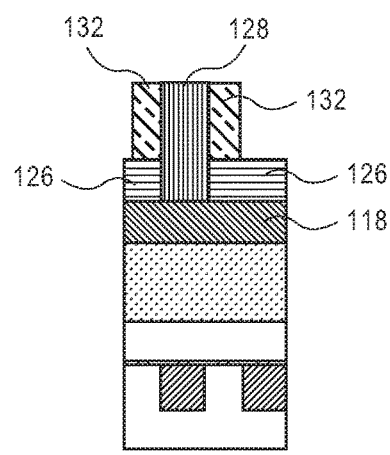
FIG. 1M        FIG. 1N

PLAN VIEWS
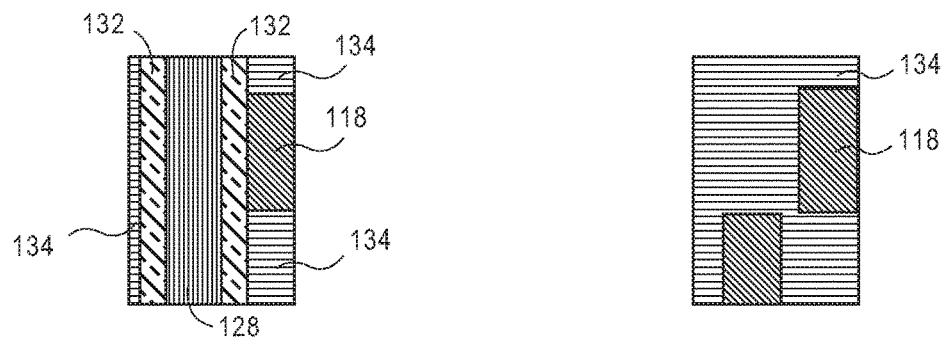
ANGLED VIEWS
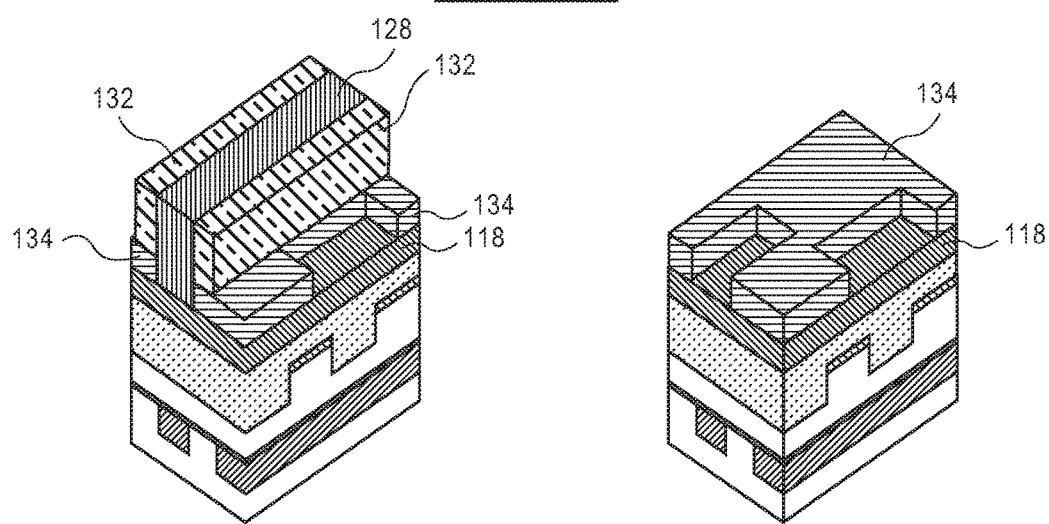
CROSS-SECTIONAL VIEWS
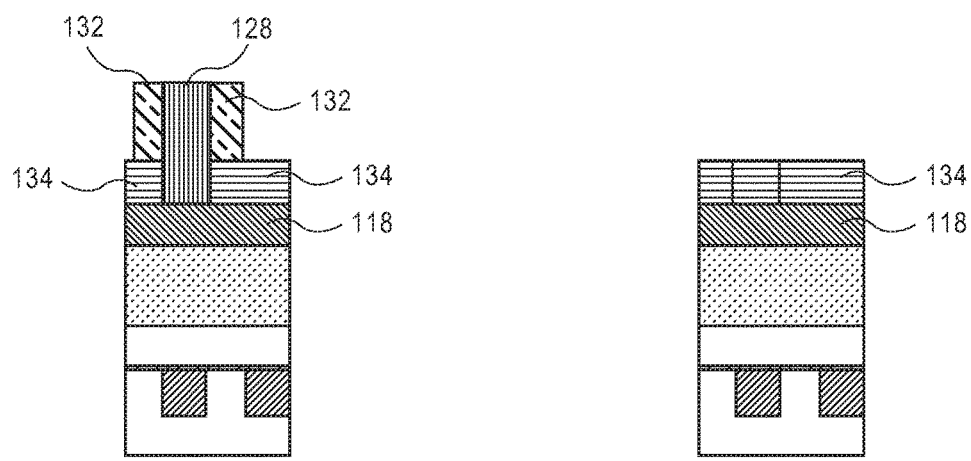
FIG. 1O  FIG. 1P PLAN VIEWS
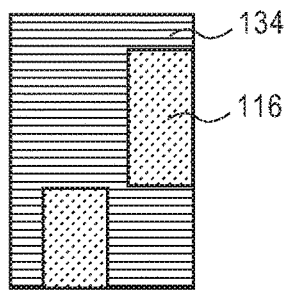
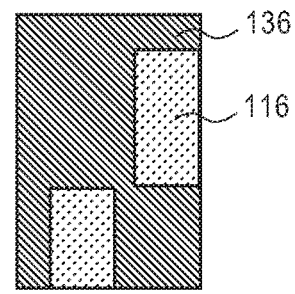
ANGLED VIEWS
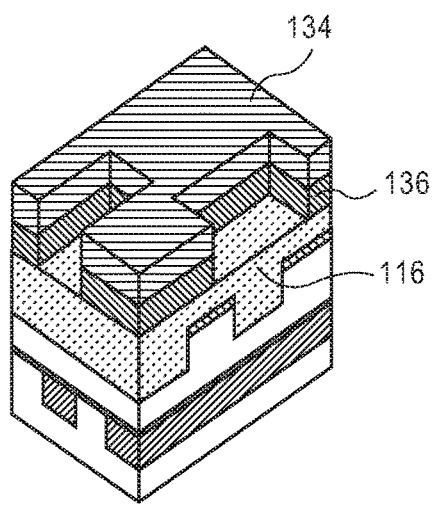
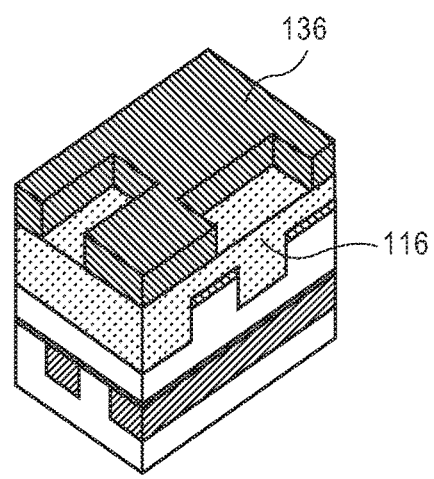
CROSS-SECTIONAL VIEWS
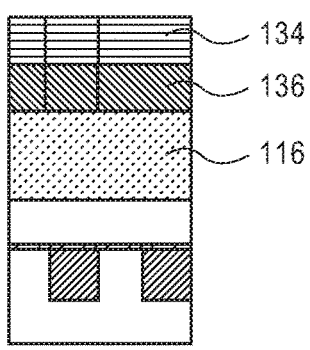
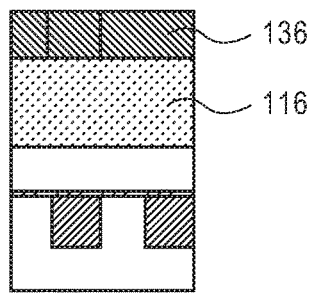
FIG. 1Q   FIG. 1R

PLAN VIEWS
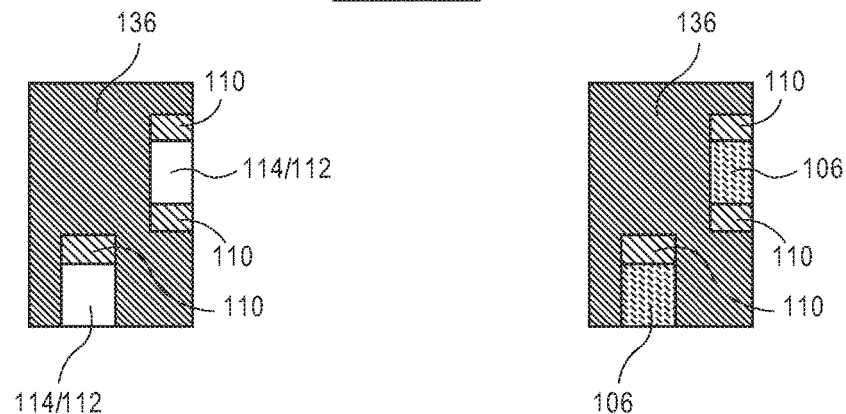
ANGLED VIEWS
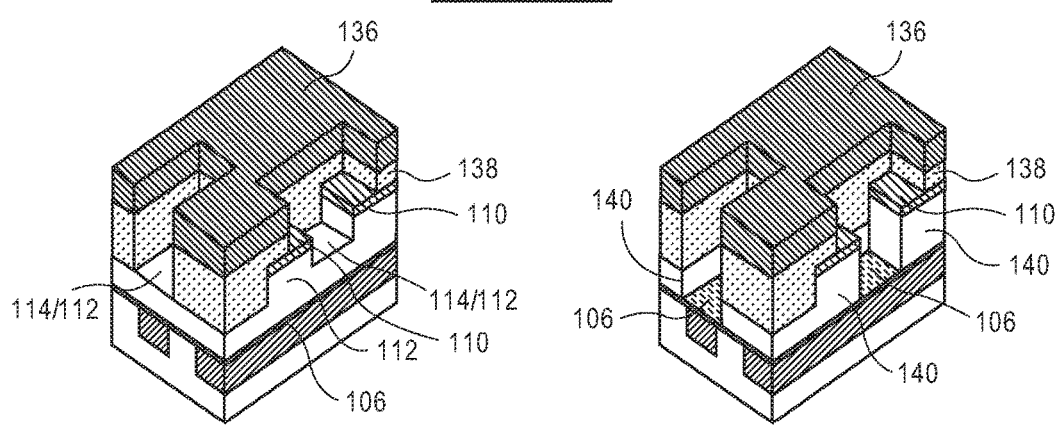
CROSS-SECTIONAL VIEWS
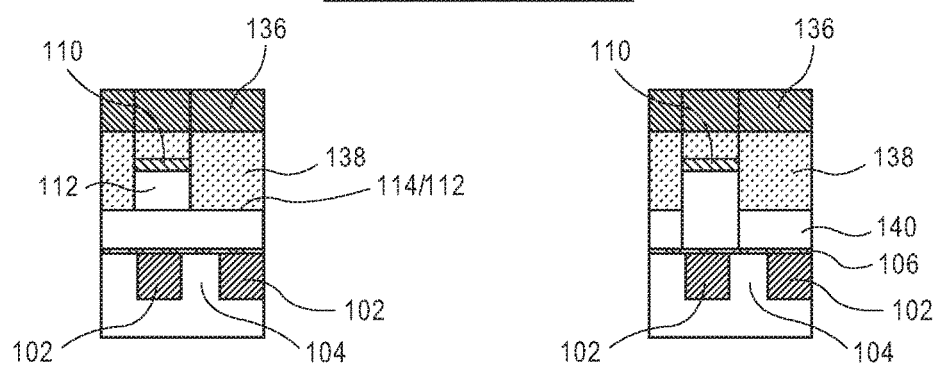
FIG. 1S  FIG. 1T

PLAN VIEWS
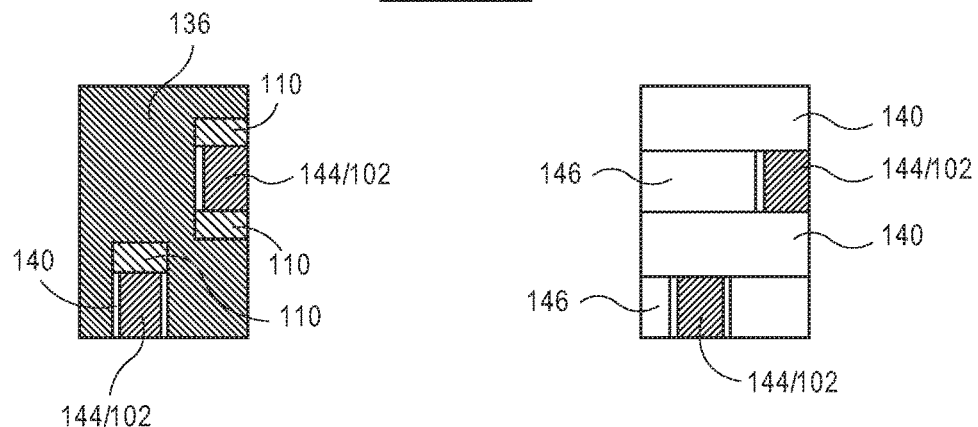
ANGLED VIEWS
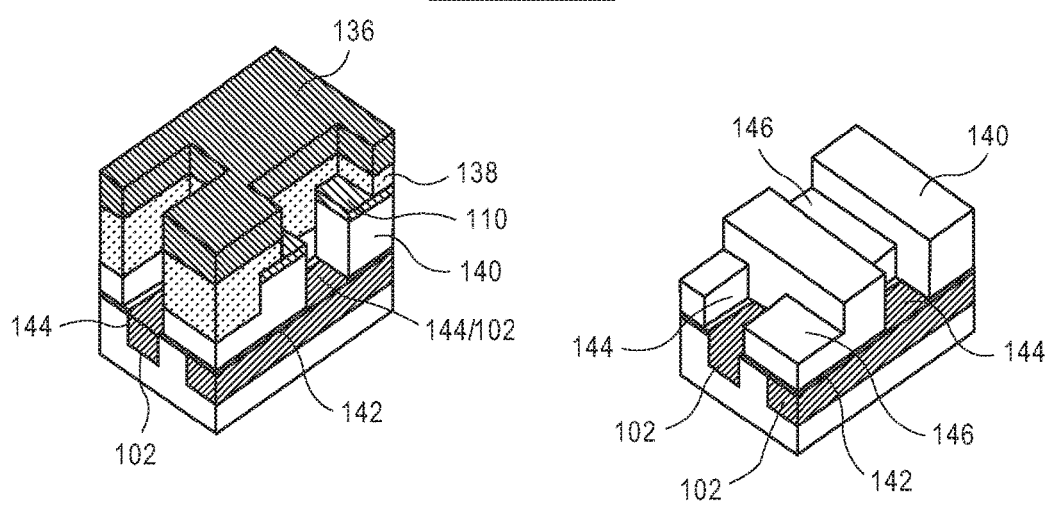
CROSS-SECTIONAL VIEWS
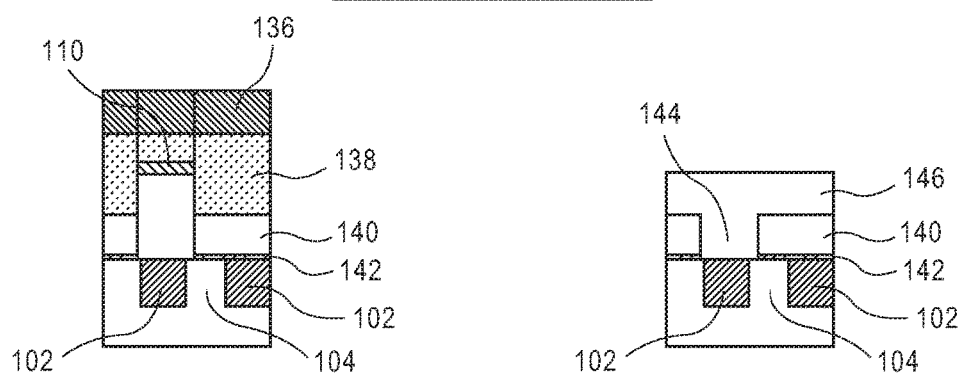
FIG. 1U                FIG. 1V

PLAN VIEWS

ANGLED VIEWS

CROSS-SECTIONAL VIEWS

US 10,319,625 B2

METAL VIA PROCESSING SCHEMES WITH VIA CRITICAL DIMENSION (CD) CONTROL FOR BACK END OF LINE (BEOL) INTERCONNECTS AND THE RESULTING STRUCTURES

CROSS-REFERENCE TO RELATED APPLICATION

This patent application is a U.S. National Phase Application under 35 U.S.C. § 371 of International Application No. PCT/US2015/067431, filed Dec. 22, 2015, entitled "METAL VIA PROCESSING SCHEMES WITH VIA CRITICAL DIMENSION (CD) CONTROL FOR BACK END OF LINE (BEOL) INTERCONNECTS AND THE RESULTING STRUCTURES," which designates the United States of America, the entire disclosure of which is hereby incorporated by reference in its entirety and for all purposes.

TECHNICAL FIELD

Embodiments of the invention are in the field of semiconductor structures and processing and, in particular, metal via processing schemes with via critical dimension (CD) control for back end of line (BEOL) interconnects and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via. The above process may be referred to as a dual damascene process.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIGS. 1A-1W illustrate plan views and corresponding angled and cross-sectional views representing various operations in a metal via processing scheme for back end of line (BEOL) interconnects, in accordance with an embodiment of the present invention.

DESCRIPTION OF THE EMBODIMENTS

Figure 1W:
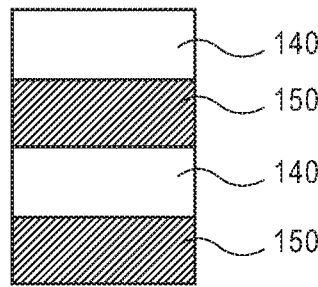
Figure 1W:
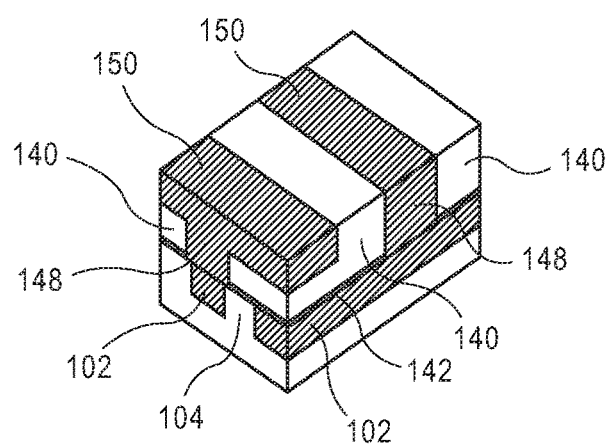
Figure 1W:
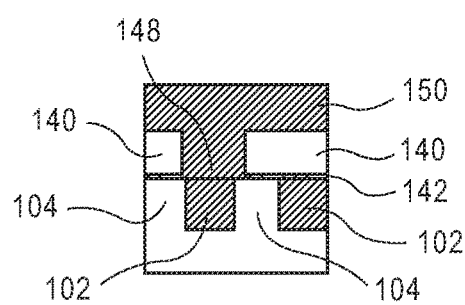

Metal via processing schemes with via critical dimension (CD) control for back end of line (BEOL) interconnects, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to process schemes for via critical dimension (CD) control. Embodiments may include improvements related to via CD control, via CD uniformity, edge placement error (EPE), via self-alignment. Embodiments may improve edge placement error (EPE) in semiconductor patterning of vias and may enable self-alignment of multiple via lithography passes. In an embodiment, all via edges are defined with gratings instead of standard resist edges. A sacrificial grating is created beneath the via resist in the same direction as the metal the vias are landing on. Vias are patterned with standard photoresist. However, during subsequent etches through the sacrificial grating and the grating of a self-aligned via (SAV) metal grating (e.g., two crossed gratings), all via edges are defined by the gratings. In an embodiment, no variability from the via resist edge is transferred into the substrate, and the resulting process capability enables better control of via CDs and improves yields and process capability.

To provide context for embodiments described below, state-of-the-art solutions involve the use of a resist edge to define a via edge which determines the shorting margin to the metal below. However, standard via resist patterning is known to have much higher edge placement error than grating patterning. By contrast, in accordance with embodiments described herein, by using a sacrificial grating to define via edge provides much improves control of the via edge, and the risk of shorting to the wrong metal is greatly improved.

In accordance with embodiments described herein, a pattern accumulation flow is described for multiple via patterns with a sacrificial grating in the stack to define via edges post etch. A "sieve" stack is built by coating a hardmask on a patterned upper metal (M1) inter-layer dielectric layer with plugs already present. The hardmask planarizes the wafer for subsequent processing. The next layer formed may be used as an etch stop, followed by formation of an accumulation layer. At this stage, a grating may be created at twice the pitch of the underlying lower metal (M0) layer and in the same direction as the M0 grating. This grating effectively blocks every other M0 lines below and ultimately defines the critical dimension (CD) of the via post etch. In an embodiment, since the grating is twice the pitch of the underlying M0, a substantial amount of hardmask (+/−20 nm) between vias is included to allow for edge placement error (EPE) of an overlying resist feature.

Next, multiple via mask patterns are accumulated through a grating and in an accumulation layer. After accumulation, the grating is inverted without an extra lithography operation in order to expose other lower metal (M0) lines and protect the vias which have already created. A liner is added between gratings to ensure vias on adjacent M0 lines do not merge. Spacing between vias can be modulated with the thickness of the liner.

Finally, the via patterns from one to several via masks can be accumulated through the inverted grating to complete patterning in the accumulation of all drawn vias. The grating is then removed and the accumulated via pattern in the accumulation layer is etched down through the upper metal (M1) hardmask grating into the inter-layer dielectric below the M1 lines and to the M0 below. The stack above the M1 grating and the overlying hardmask layer are removed. Subsequently, trenches and vias are metallized and then polished. The result is very good CD control of the formed vias in both directions, and self-alignment of all the vias to one another.

In an aspect, then, one or more embodiments described herein are directed to an approach that employs an underlying metal grating structure, or a pair of orthogonal such structures, as a template to build overlying conductive vias. Vias, by definition, are used to land on a previous layer metal pattern. It is to be appreciated that similar approaches may be implemented to fabricate non-conductive spaces or interruptions between metals (referred to as "plugs"). In this vein, embodiments described herein enable a more robust interconnect fabrication scheme since alignment by lithography equipment is relied on to a lesser extent. Such an interconnect fabrication scheme can be used to improve electrical contact (e.g., by reducing via resistance).

It is to be appreciated that a pattern needed to select a pre-formed via location can be made to be relatively large, enabling an increase in the overlay margin of a lithographic process. The pattern features can be made of uniform size, which can reduce scan time on direct write ebeam and/or optical proximity correction (OPC) complexity with optical lithography.

In an exemplary processing scheme, FIGS. 1A-1W illustrate plan views (upper portions of Figures) and corresponding angled (middle portions of Figures) and cross-sectional views (lower portions of Figures) representing various operations in a metal via processing schemes for back end of line (BEOL) interconnects, in accordance with an embodiment of the present invention.

Referring to FIG. 1A, a starting point structure 100 is provided as a beginning point for fabricating a new metallization layer. The starting point structure 100 includes an array of alternating metal lines 102 and dielectric lines 104. The metal lines 102 are approximately with the dielectric lines 104. An etch stop layer 106 is then formed on the starting structure 100, as is depicted in FIG. 1B.

Referring to FIG. 1C, an inter-layer dielectric layer 108 is formed on the structure of FIG. 1B. A patterned hardmask 110 is then formed on the structure of FIG. 1C, and the pattern of the patterned hardmask 110 is transferred partially into the inter-layer dielectric layer 108 to form patterned inter-layer dielectric layer 112 having metal line regions 114 formed therein, as is depicted in FIG. 1D. In an embodiment, the patterned hardmask 110 has a grating type pattern, as is depicted. In a specific embodiment, the patterned hardmask 110 is composed of titanium nitride (TiN).

Referring to FIG. 1E, a hardmask layer 116 is formed on the structure of FIG. 1D. In an embodiment, the bottom surface of the hardmask layer 116 is conformal with the topography of the structure of FIG. 1D, while the upper surface of the hardmask layer 116 is planarized. In a specific embodiment, the hardmask layer 116 is a carbon hardmask (CHM) layer. An etch stop layer 118 is then formed on the structure of FIG. 1E, as is depicted in FIG. 1F. In a specific embodiment, the etch stop layer 118 is composed of silicon oxide (SiOx or $SiO_2$).

Referring to FIG. 1G, a pattern accumulation layer 120 is then formed on the structure of FIG. 1F. In an embodiment, the pattern accumulation layer 120 is a layer in which more than one pattern will ultimately accumulate, e.g., for eventual via patterning. In a specific embodiment, the pattern accumulation layer 120 is composed of amorphous silicon (a-Si). A patterned hardmask 122 is then formed on the structure of FIG. 1G, as is depicted in FIG. 1H. In an embodiment, the patterned hardmask 122 has a grating type pattern, as is depicted. In one such embodiment, the grating type pattern is orthogonal to the grating of patterned hardmask 110 and parallel to the grating of the metal lines 102. However, in an embodiment, from a top down perspective, the patterned hardmask 122 exposes only every other of the metal lines 102 (e.g., metal line 102 (A)) and blocks alternating ones of the metal lines 102 (e.g., metal line 102 (B)), as is depicted in FIG. 1H. In a specific embodiment, the patterned hardmask 122 is composed of silicon nitride (SiN).

Referring to FIG. 1I, a hardmask 124 is then formed on the structure of FIG. 1H. In a specific embodiment, the hardmask 124 is a carbon hardmask (CHM). The hardmask 124 is then patterned (e.g., by a lithographic process using single or multiple layer resist structures) and the pattern is transferred into portions of the pattern accumulation layer 120 exposed by the patterned hardmask 122 to form a once patterned memory layer 126, as is depicted in FIG. 1J. In an embodiment, the pattern is transferred into portions of the pattern accumulation layer 120 by an etch process that uses etch stop layer 118 as a terminating point. In an embodiment, subsequent to forming the once patterned memory layer 126, the hardmask 124 is removed, as is also depicted in FIG. 1J. It is to be appreciated that the process may be repeated for several different masking operations.

Referring to FIG. 1K, a blocking line 128 is then formed by filling the opening in patterned hardmask 122 of the structure of FIG. 1J with a blocking material layer. In a specific embodiment, the blocking material layer is a flowable silicon oxide material. The patterned hardmask 122 is then removed from the structure of FIG. 1K to leave the blocking line 128 remaining, as is depicted in FIG. 1L.

Referring to FIG. 1M, an insulating spacer forming material layer 130 is then formed on the structure of FIG. 1L, conformal with the blocking line 128. In an embodiment, the insulating spacer forming material layer 130 is composed of a dielectric material. In one embodiment, the spacer forming material layer 130 is composed of silicon oxide (SiOx or $SiO_2$). The spacer forming material layer 130 is then patterned to form spacers 132 adjacent the sidewalls of the blocking line 128, as is depicted in FIG. 1N. In an embodiment, the spacer forming material layer 130 is patterned to form spacers 132 using an anisotropic dry etch process.

Referring to FIG. 1O, a collective pattern of the blocking line 128, the spacers 132, and protective regions of a patterning mask formed subsequent to forming the spacers 132 is then transferred into the once patterned memory layer 126 to form a twice patterned memory layer 134. In an embodiment, the pattern is transferred into the once patterned memory layer 126 by an etch process that uses etch stop layer 118 as a terminating point. The blocking line 128, the spacers 132, and any additional mask material of the structure of FIG. 1O are then removed to expose the twice patterned memory layer 134, as is depicted in FIG. 1P.

Referring to FIG. 1Q, the pattern of the twice patterned memory layer 134 of the structure of FIG. 1P is then transferred to the etch stop layer 118 to form patterned etch stop layer 136 and to expose portion of the hardmask layer 116. In one embodiment, the pattern of the twice patterned memory layer 134 is transferred to the etch stop layer 118 using a dry etch process. The twice patterned memory layer 134 of the structure of FIG. 1Q is then removed, as is depicted in FIG. 1R.

Referring to FIG. 1S, the pattern of the patterned etch stop layer 136 of the structure of FIG. 1R is then transferred into the hardmask layer 116 to form patterned hardmask layer 138. Patterned hardmask layer 138 exposes portions of the line regions 114 of the patterned inter-layer dielectric layer 112 and portions of the patterned hardmask 110. That is, although the patterned hardmask layer 138 exposes areas wider than the line regions 114 of the patterned inter-layer dielectric layer 112, the patterned hardmask 110 protects "exposed" regions of the patterned inter-layer dielectric layer 112 outside of the line regions 114. The pattern of the patterned hardmask layer 138 of the structure of FIG. 1S is then transferred to the patterned inter-layer dielectric layer 112 to form twice patterned inter-layer dielectric layer 140 and to expose etch stop layer 106, as is depicted in FIG. 1T. However, in an embodiment, the patterned hardmask 110 inhibits total transfer pattern, as is also depicted in FIG. 1T. In one embodiment, the pattern of the patterned hardmask layer 138 is transferred to the patterned inter-layer dielectric layer 112 by an etch process that uses etch stop layer 106 as a terminating point.

Referring to FIG. 1U, exposed portions of the etch stop layer 106 of the structure of FIG. 1T are removed to form patterned etch stop layer 142 and to expose via locations 144 for metal lines 102. The patterned etch stop layer 136, the patterned hardmask layer 138, and the patterned hardmask 110 of the structure of FIG. 1U are then removed, as is depicted in FIG. 1V. The removal exposes twice patterned inter-layer dielectric layer 140 and via locations 144 for metal lines 102, as well as locations 146 for upper metal lines. In an embodiment, the patterned etch stop layer 136, the patterned hardmask layer 138, and the patterned hardmask 110 are removed using a selective wet etch process.

Referring to FIG. 1W, an upper metallization layer is formed for the structure of FIG. 1V. In particular, a metal fill process is performed to provide metal vias 148 and metal lines 150. In an embodiment, the metal fill process is performed using a metal deposition and subsequent planarization processing scheme, such as a chemical mechanical planarization (CMP) process. In an embodiment, the surface of the structure formed of FIG. 1W is substantially the same as the surface of, although orthogonal to, the starting structure 100 of FIG. 1A. Thus, in an embodiment, the process described in association with FIGS. 1B-1W may be repeated on the structure of FIG. 1W to form a next metallization layer, and so on.

A resulting structure such as described in association with FIG. 1W may subsequently be used as a foundation for forming subsequent metal line/via and ILD layers. Alternatively, the structure of FIG. 1W may represent the final metal interconnect layer in an integrated circuit. It is to be appreciated that the above process operations may be practiced in alternative sequences, not every operation need be performed and/or additional process operations may be performed. It is also to be appreciated that the above examples have focused on via/contact formation. However, in other embodiments, similar approaches may be used to preserve or form regions for line end termination (plugs) within a metal line layer.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials (and in some instances etch stop layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIGS. 1A-1W are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1W (i.e., as starting from FIG. 1A) may be fabricated on underlying lower level interconnect layers.

As described above, patterned features may be patterned in a grating-like pattern with lines, holes or trenches spaced at a constant pitch and having a constant width. The pattern, for example, may be fabricated by a pitch division approach, such as pitch halving or pitch quartering. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 2:
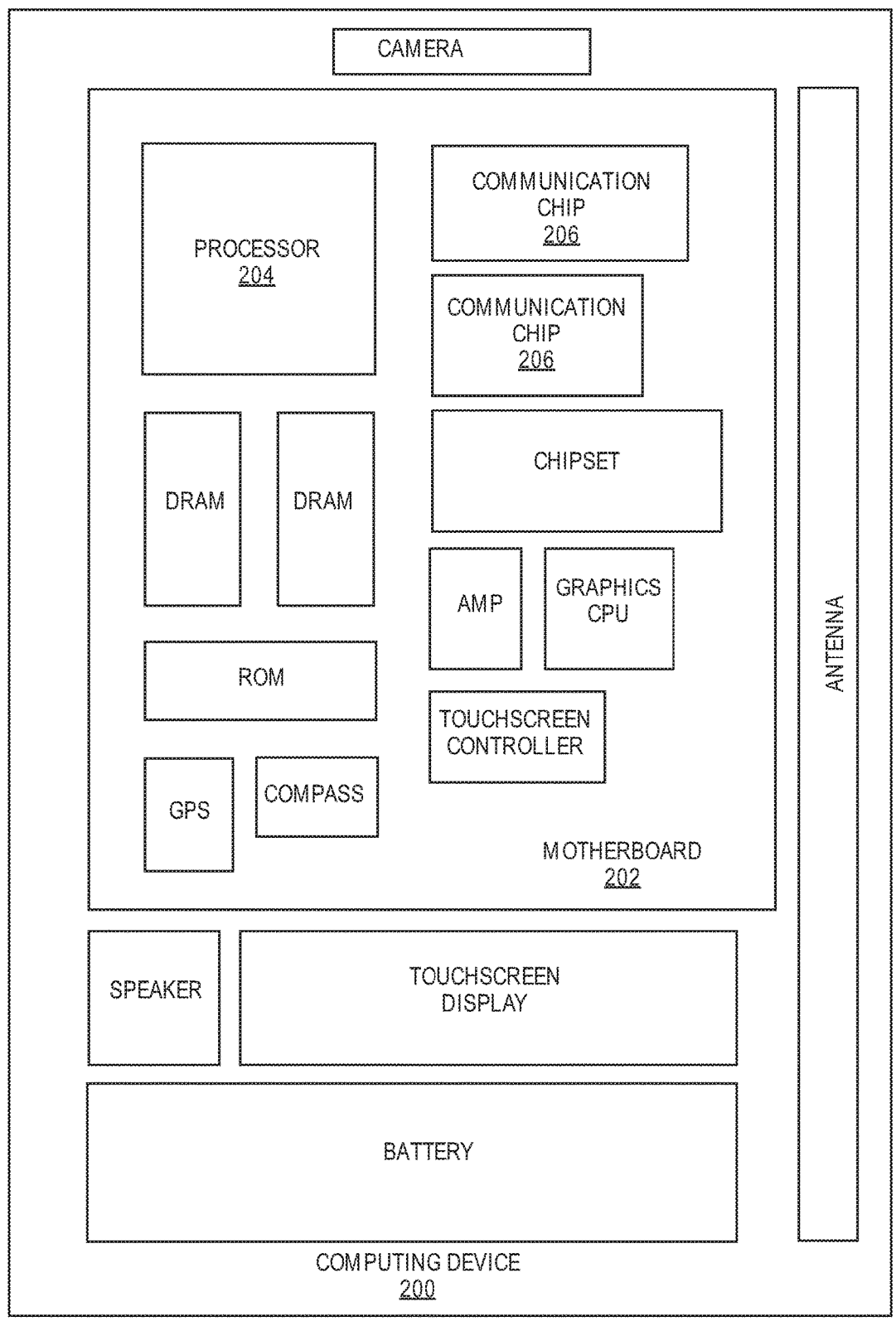
FIG. 2 illustrates a computing device in accordance with one implementation of an embodiment of the invention.

FIG. 2 illustrates a computing device 200 in accordance with one implementation of the invention. The computing device 200 houses a board 202. The board 202 may include a number of components, including but not limited to a processor 204 and at least one communication chip 206. The processor 204 is physically and electrically coupled to the board 202. In some implementations the at least one communication chip 206 is also physically and electrically coupled to the board 202. In further implementations, the communication chip 206 is part of the processor 204.

Depending on its applications, computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206 enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206. For instance, a first communication chip 206 may be dedicated to shorter range wireless communications such as Wi-Fi and Bluetooth and a second communication chip 206 may be dedicated to longer range wireless communications such as GPS, EDGE, GPRS, CDMA, WiMAX, LTE, Ev-DO, and others.

The processor 204 of the computing device 200 includes an integrated circuit die packaged within the processor 204. In some implementations of embodiments of the invention, the integrated circuit die of the processor includes one or more structures, such as self-aligned vias, built in accordance with implementations of embodiments of the invention. The term "processor" may refer to any device or portion of a device that processes electronic data from registers and/or memory to transform that electronic data into other electronic data that may be stored in registers and/or memory.

The communication chip 206 also includes an integrated circuit die packaged within the communication chip 206. In accordance with another implementation of embodiments of the invention, the integrated circuit die of the communication chip includes one or more structures, such as self-aligned vias, built in accordance with implementations of embodiments of the invention.

In further implementations, another component housed within the computing device 200 may contain an integrated circuit die that includes one or more structures, such as self-aligned vias, built in accordance with implementations of embodiments of the invention.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

Figure 3:
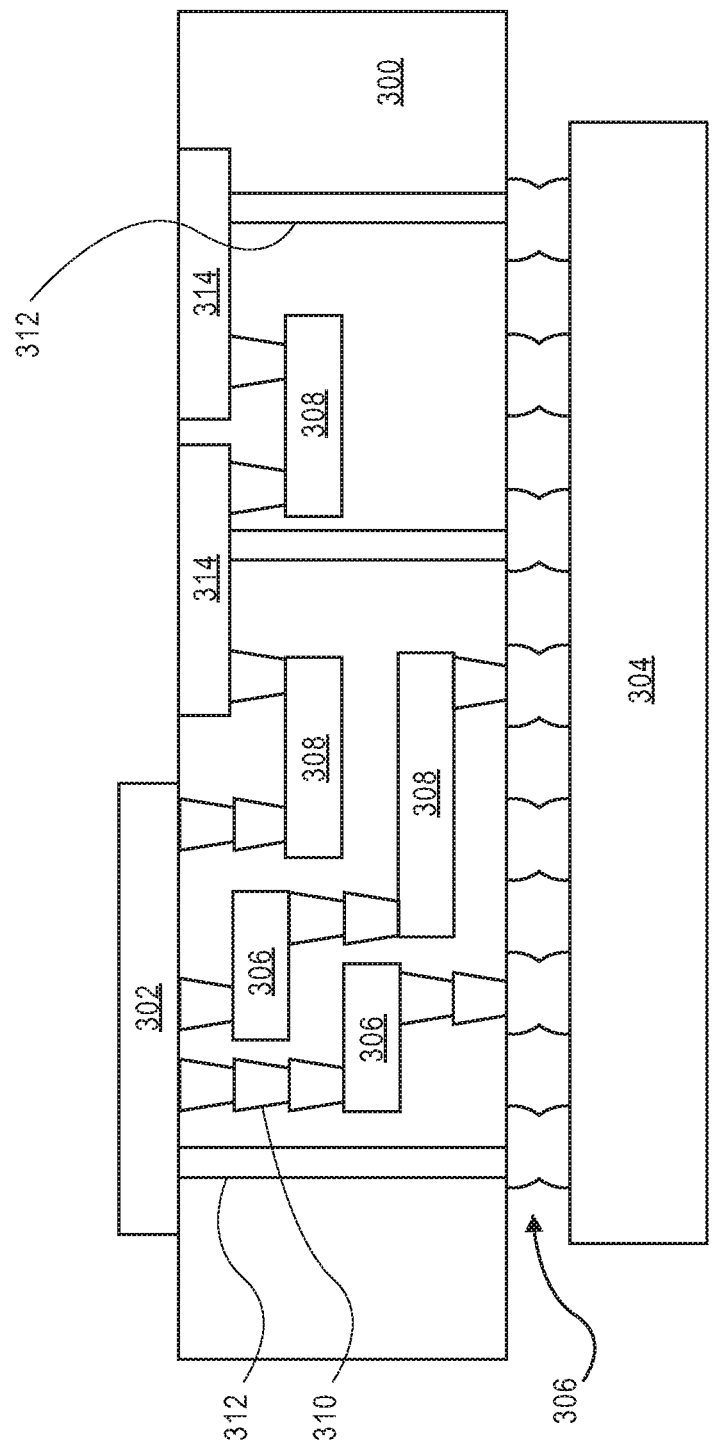
FIG. 3 is an interposer implementing one or more embodiments of the invention.

FIG. 3 illustrates an interposer 300 that includes one or more embodiments of the invention. The interposer 300 is an intervening substrate used to bridge a first substrate 302 to a second substrate 304. The first substrate 302 may be, for instance, an integrated circuit die. The second substrate 304 may be, for instance, a memory module, a computer motherboard, or another integrated circuit die. Generally, the purpose of an interposer 300 is to spread a connection to a wider pitch or to reroute a connection to a different connection. For example, an interposer 300 may couple an integrated circuit die to a ball grid array (BGA) 306 that can subsequently be coupled to the second substrate 304. In some embodiments, the first and second substrates 302/304 are attached to opposing sides of the interposer 300. In other embodiments, the first and second substrates 302/304 are attached to the same side of the interposer 300. And in further embodiments, three or more substrates are interconnected by way of the interposer 300.

The interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. The interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 300. In accordance with embodiments of the invention, apparatuses or processes disclosed herein may be used in the fabrication of interposer 300.

Thus, embodiments of the present invention include metal via processing schemes with via critical dimension (CD) control for back end of line (BEOL) interconnects, and the resulting structures.

In an embodiment, a method of fabricating an interconnect structure for a semiconductor die includes forming a lower metallization layer including alternating metal lines and dielectric lines above a substrate. The method also includes forming an inter-layer dielectric layer above the metallization layer. The method also includes forming a first grating pattern above the inter-layer dielectric layer, orthogonal to the alternating metal lines and dielectric lines of the lower metallization layer. The method also includes forming a second grating pattern above the first grating pattern. The method also includes patterning the inter-layer dielectric layer using the first grating pattern and the second grating pattern to form via locations and line regions in the inter-layer dielectric layer. The method also includes forming metal vias and metal lines in the via locations and line regions, respectively, of the inter-layer dielectric layer.

In one embodiment, the method further includes removing the first grating pattern and the second grating pattern prior to forming metal vias and metal lines in the via locations and line regions.

In one embodiment, the method further includes forming a pattern accumulation layer between the first grating pattern and the second grating pattern.

In one embodiment, the method further includes patterning the pattern accumulation layer twice prior to forming the form via locations in the inter-layer dielectric layer.

In one embodiment, forming the first grating pattern includes using a pitch division processing scheme.

In an embodiment, a method of fabricating an interconnect structure for a semiconductor die includes forming a lower metallization layer including alternating metal lines and dielectric lines above a substrate. The method also includes forming an inter-layer dielectric layer above the metallization layer. The method also includes forming a grating pattern above the inter-layer dielectric layer, orthogonal to the alternating metal lines and dielectric lines of the lower metallization layer. The method also includes forming a pattern accumulation layer above the grating pattern. The method also includes patterning the pattern accumulation layer to form a patterned memory layer. The method also includes patterning the inter-layer dielectric layer using the grating pattern and the patterned memory layer to form via locations and line regions in the inter-layer dielectric layer. The method also includes forming metal vias and metal lines in the via locations and line regions, respectively, of the inter-layer dielectric layer.

In one embodiment, the method further includes removing the grating pattern and the patterned memory layer prior to forming the metal vias and metal lines in the via locations and line regions.

In one embodiment, patterning the pattern accumulation layer includes patterning the pattern accumulation layer twice prior to forming the form via locations in the inter-layer dielectric layer.

In one embodiment, forming the grating pattern includes using a pitch division processing scheme.

In an embodiment, a method of fabricating an interconnect structure for a semiconductor die includes forming a lower metallization layer including alternating metal lines and dielectric lines above a substrate. The method also includes forming an inter-layer dielectric layer above the metallization layer. The method also includes forming a first grating hardmask layer above the inter-layer dielectric layer, the first grating hardmask layer having a direction orthogonal to the direction of the alternating metal lines and dielectric lines of the lower metallization layer. The method also includes transferring a pattern of the first grating hardmask layer to the inter-layer dielectric layer to form a patterned inter-layer dielectric layer having line regions therein. The method also includes forming a pattern accumulation layer above the first grating hardmask layer. The method also includes forming a second grating hardmask layer above the pattern accumulation layer, the second grating hardmask layer having a direction parallel with the direction of the alternating metal lines and dielectric lines of the lower metallization layer. The method also includes, with the second grating hardmask layer in place, transferring a first via pattern to the pattern accumulation layer. The method also includes removing the second grating hardmask layer. The method also includes, subsequent to removing the second grating hardmask layer, transferring a second via pattern to the pattern accumulation layer to form a twice patterned memory layer having a pattern. The method also includes transferring the pattern of the twice patterned memory layer to the patterned inter-layer dielectric layer to form a twice patterned inter-layer dielectric layer having via locations therein. The method also includes forming metal vias and metal lines in the via locations and line regions, respectively, of the twice patterned inter-layer dielectric layer.

In one embodiment, the method further includes, prior to forming the inter-layer dielectric layer, forming a hardmask layer on the lower metallization layer, wherein the inter-layer dielectric layer is formed on the hardmask layer.

In one embodiment, transferring the pattern of the twice patterned memory layer to the patterned inter-layer dielectric layer further includes transferring the pattern of the twice patterned memory layer to the hardmask layer.

In one embodiment, the method further includes, subsequent to transferring the pattern of the first grating hardmask layer to the inter-layer dielectric layer, forming a second hardmask layer on the first grating hardmask layer and on the patterned inter-layer dielectric layer.

In one embodiment, transferring the pattern of the twice patterned memory layer to the patterned inter-layer dielectric layer further includes transferring the pattern of the twice patterned memory layer to the second hardmask layer.

In one embodiment, the method further includes, forming an etch stop layer on the second hardmask layer, wherein the pattern accumulation layer is formed on the etch stop layer.

In one embodiment, transferring the pattern of the twice patterned memory layer to the patterned inter-layer dielectric layer further includes transferring the pattern of the twice patterned memory layer to the etch stop layer.

In one embodiment, transferring the first and second via patterns to the pattern accumulation layer includes forming via areas larger than areas of the via locations formed in the inter-layer dielectric layer.

In one embodiment, transferring the pattern of the twice patterned memory layer to the patterned inter-layer dielectric layer is performed using an etch process that is blocked by exposed portions of the first grating hardmask layer.

In one embodiment, the method further includes, subsequent to forming the twice patterned inter-layer dielectric layer and prior to forming the metal vias and metal lines in the via locations and line regions, removing the first grating hardmask layer.

In one embodiment, forming the first grating hardmask layer includes using a pitch division processing scheme.

What is claimed is:

1. A method of fabricating an interconnect structure for a semiconductor die, the method comprising:
    forming a lower metallization layer comprising alternating metal lines and dielectric lines above a substrate;
    forming an inter-layer dielectric layer above the metallization layer;
    forming a first grating pattern above the inter-layer dielectric layer, orthogonal to the alternating metal lines and dielectric lines of the lower metallization layer;
    forming a second grating pattern above the first grating pattern;
    patterning the inter-layer dielectric layer using the first grating pattern and the second grating pattern to form via locations and line regions in the inter-layer dielectric layer; and
    forming metal vias and metal lines in the via locations and line regions, respectively, of the inter-layer dielectric layer.

2. The method of claim 1, further comprising:
    removing the first grating pattern and the second grating pattern prior to forming the metal vias and metal lines in the via locations and line regions.

3. The method of claim 1, further comprising:
    forming a pattern accumulation layer between the first grating pattern and the second grating pattern.

4. The method of claim 3, further comprising:
    patterning the pattern accumulation layer twice prior to forming the via locations in the inter-layer dielectric layer.

5. The method of claim 1, wherein forming the first grating pattern comprises using a pitch division processing scheme.

6. A method of fabricating an interconnect structure for a semiconductor die, the method comprising:
    forming a lower metallization layer comprising alternating metal lines and dielectric lines above a substrate;
    forming an inter-layer dielectric layer above the metallization layer;
    forming a grating pattern above the inter-layer dielectric layer, orthogonal to the alternating metal lines and dielectric lines of the lower metallization layer, wherein intersections of the grating pattern and the alternating metal lines and dielectric lines of the lower metallization layer define possible via locations for a metallization layer;
    forming a pattern accumulation layer above the grating pattern;
    patterning the pattern accumulation layer to form a patterned memory layer;
    patterning the inter-layer dielectric layer using the grating pattern and the patterned memory layer to form via locations and line regions in the inter-layer dielectric layer; and
    forming metal vias and metal lines in the via locations and line regions, respectively, of the inter-layer dielectric layer.

7. The method of claim 6, further comprising:
    removing the grating pattern and the patterned memory layer prior to forming the metal vias and metal lines in the via locations and line regions.

8. The method of claim 6, wherein patterning the pattern accumulation layer comprises patterning the pattern accumulation layer twice prior to forming the form via locations in the inter-layer dielectric layer.

9. The method of claim 6, wherein forming the grating pattern comprises using a pitch division processing scheme.

10. A method of fabricating an interconnect structure for a semiconductor die, the method comprising:
    forming a lower metallization layer comprising alternating metal lines and dielectric lines above a substrate;
    forming an inter-layer dielectric layer above the metallization layer;
    forming a first grating hardmask layer above the inter-layer dielectric layer, the first grating hardmask layer having a direction orthogonal to the direction of the alternating metal lines and dielectric lines of the lower metallization layer;

transferring a pattern of the first grating hardmask layer to the inter-layer dielectric layer to form a patterned inter-layer dielectric layer having line regions therein;

forming a pattern accumulation layer above the first grating hardmask layer;

forming a second grating hardmask layer above the pattern accumulation layer, the second grating hardmask layer having a direction parallel with the direction of the alternating metal lines and dielectric lines of the lower metallization layer;

with the second grating hardmask layer in place, transferring a first via pattern to the pattern accumulation layer;

removing the second grating hardmask layer;

subsequent to removing the second grating hardmask layer, transferring a second via pattern to the pattern accumulation layer to form a twice patterned memory layer having a pattern;

transferring the pattern of the twice patterned memory layer to the patterned inter-layer dielectric layer to form a twice patterned inter-layer dielectric layer having via locations therein; and forming metal vias and metal lines in the via locations and line regions, respectively, of the twice patterned inter-layer dielectric layer.

11. The method of claim 10, further comprising:
prior to forming the inter-layer dielectric layer, forming a hardmask layer on the lower metallization layer, wherein the inter-layer dielectric layer is formed on the hardmask layer.

12. The method of claim 11, wherein transferring the pattern of the twice patterned memory layer to the patterned inter-layer dielectric layer further comprises transferring the pattern of the twice patterned memory layer to the hardmask layer.

13. The method of claim 11, further comprising:
subsequent to transferring the pattern of the first grating hardmask layer to the inter-layer dielectric layer, forming a second hardmask layer on the first grating hardmask layer and on the patterned inter-layer dielectric layer.

14. The method of claim 13, wherein transferring the pattern of the twice patterned memory layer to the patterned inter-layer dielectric layer further comprises transferring the pattern of the twice patterned memory layer to the second hardmask layer.

15. The method of claim 13, further comprising:
forming an etch stop layer on the second hardmask layer, wherein the pattern accumulation layer is formed on the etch stop layer.

16. The method of claim 15, wherein transferring the pattern of the twice patterned memory layer to the patterned inter-layer dielectric layer further comprises transferring the pattern of the twice patterned memory layer to the etch stop layer.

17. The method of claim 10, wherein transferring the first and second via patterns to the pattern accumulation layer comprises forming via areas larger than areas of the via locations formed in the inter-layer dielectric layer.

18. The method of claim 17, wherein transferring the pattern of the twice patterned memory layer to the patterned inter-layer dielectric layer is performed using an etch process that is blocked by exposed portions of the first grating hardmask layer.

19. The method of claim 18, further comprising:
subsequent to forming the twice patterned inter-layer dielectric layer and prior to forming the metal vias and metal lines in the via locations and line regions, removing the first grating hardmask layer.

20. The method of claim 10, wherein forming the first grating hardmask layer comprises using a pitch division processing scheme.

* * * * *